US012431930B2

(12) United States Patent
Su et al.

(10) Patent No.: US 12,431,930 B2
(45) Date of Patent: Sep. 30, 2025

(54) POWER MIXER, RADIO FREQUENCY CIRCUIT, DEVICE AND EQUIPMENT

(71) Applicant: CHONGQING BARROT TECHNOLOGY LIMITED, Chongqing (CN)

(72) Inventors: Jie Su, Chongqing (CN); Yizhe Xu, Chongqing (CN); Yong Zhu, Chongqing (CN)

(73) Assignee: CHANGQING BARROT TECHNOLOGY LIMITED, Chongqing (CN)

( * ) Notice: Subject to any disclaimer, the term of this patent is extended or adjusted under 35 U.S.C. 154(b) by 496 days.

(21) Appl. No.: 17/909,439

(22) PCT Filed: Dec. 31, 2020

(86) PCT No.: PCT/CN2020/142275
§ 371 (c)(1),
(2) Date: Sep. 6, 2022

(87) PCT Pub. No.: WO2021/174993
PCT Pub. Date: Sep. 10, 2021

(65) Prior Publication Data
US 2023/0155619 A1 May 18, 2023

(30) Foreign Application Priority Data
Mar. 6, 2020 (CN) .......................... 202010151051.X

(51) Int. Cl.
*H04B 1/30* (2006.01)
*H03D 7/16* (2006.01)
*H04B 1/40* (2015.01)

(52) U.S. Cl.
CPC ................. *H04B 1/30* (2013.01); *H03D 7/16* (2013.01); *H04B 1/40* (2013.01); *H04B 2001/307* (2013.01)

(58) Field of Classification Search
CPC ...... H04B 1/30; H04B 1/40; H04B 2001/307; H03D 7/16; H03D 2200/0023;
(Continued)

(56) References Cited

U.S. PATENT DOCUMENTS 7,529,529 B2 * 5/2009 Taylor ...................... H04B 1/30
455/333
9,209,845 B2 * 12/2015 Nentwig .................. H04B 1/30
(Continued)

FOREIGN PATENT DOCUMENTS

CN   1685623   10/2005
CN   1801604   7/2006
(Continued)

OTHER PUBLICATIONS

"International Search Report (Form PCT/ISA/210) of PCT/CN2020/142275," mailed on Mar. 26, 2021, with English translation thereof, pp. 1-5.

*Primary Examiner* — Lana N Le
(74) *Attorney, Agent, or Firm* — JCIPRNET

(57) ABSTRACT

The invention discloses a power mixer, radio frequency circuit, device and equipment, and belongs to the technical field of electronics and communication. The power mixer includes a mixer module, which amplifies an analog baseband current signal by a silicon germanium heterojunction bipolar transistor amplifying circuit, and converts a local oscillator voltage signal into a local oscillator current signal by a silicon germanium heterojunction bipolar transistor switching circuit. The silicon germanium heterojunction bipolar transistor switching circuit receives an amplified analog baseband current signal, and mixes the amplified
(Continued)

analog baseband current signal and the local oscillator current signal into a radio frequency current signal; and a transformer module, which converts the radio frequency current signal into a radio frequency power signal and then outputs the radio frequency power signal from the power mixer.

8 Claims, 3 Drawing Sheets

(58) Field of Classification Search
CPC ......... H03D 2200/0043; H03D 7/1433; H03D 7/1441; H03D 7/1458; H03D 7/1491; H03D 7/165; H03D 7/125; H03D 7/1466; H03D 7/1483; H03D 3/007; H03F 1/302; H03F 3/19; H03F 2200/54; H03F 2200/372; H03F 3/195; H03F 2200/18; H03F 2203/7206; H03F 3/72; H03F 2200/492; H03F 3/3432; H03F 2200/504; H03F 2203/45544; H03F 1/0277; H03F 1/3205; H03F 1/342; H03F 2200/555; H03F 2203/45154; H03F 1/083; H03F 2203/45594; H03F 2203/45596; H03F 2203/21178; H03F 2200/411; H03H 7/0115; H03H 7/1775; H03H 2001/0078; H03H 2210/025; H03H 7/1766; H03H 7/1791; H03H 7/48; H01F 5/003; H03G 3/3042; H03G 1/007

See application file for complete search history.

(56) References Cited

U.S. PATENT DOCUMENTS

| | | |
|---|---|---|
| 2002/0030541 A1 | 3/2002 | Tsutsui et al. |
| 2003/0094976 A1* | 5/2003 | Miyashita ............ H03D 7/1458 |
| 2005/0124311 A1* | 6/2005 | Mahmoudi .......... H03D 7/1458 |
| | | 455/323 |
| 2010/0091688 A1* | 4/2010 | Staszewski .............. H04B 1/30 |
| 2011/0273248 A1* | 11/2011 | Nicolson ................... H04B 1/40 |
| 2024/0146344 A1* | 5/2024 | Tan ......................... H03D 7/165 |

FOREIGN PATENT DOCUMENTS

| | | | | |
|---|---|---|---|---|
| CN | 101951224 A | * | 1/2011 | |
| CN | 102332866 | | 1/2012 | |
| CN | 103580714 | | 2/2014 | |
| CN | 103580714 A | * | 2/2014 | |
| CN | 108683409 | | 10/2018 | |
| CN | 111245371 | | 6/2020 | |
| WO | WO-2019223541 A1 | * | 11/2019 | ............... H03D 7/16 |

* cited by examiner

US 12,431,930 B2

POWER MIXER, RADIO FREQUENCY CIRCUIT, DEVICE AND EQUIPMENT

CROSS-REFERENCE TO RELATED APPLICATION

This application is a 371 of international application of PCT application serial no. PCT/CN2020/142275, filed on Dec. 31, 2020, which claims the priority benefit of China application no. 202010151051.X, filed on Mar. 6, 2020. The entirety of each of the above mentioned patent applications is hereby incorporated by reference herein and made a part of this specification.

TECHNICAL FIELD

The invention relates to the technical field of electronics and communication, in particular a power mixer, radio frequency circuit, device and equipment.

BACKGROUND

The commonly used CMOS up-mixer in the prior art (as shown in FIG. 1) includes six NMOS transistors (M1~M6) and the baseband voltage signal is input from the gates of M5 and M6. The baseband voltage signal is converted into a baseband current signal by the action of M5 and M6, and is output by the drains of M5 and M6.

M1~M4 are switch tubes, the local oscillator signal is input from the gate of M1~M4, and the baseband current signal input by the drain of M5 and M6 is switched and transmitted to M1~M4 according to the frequency of the local oscillator signal, so as to realize the frequency addition. The final radio frequency current signal is converted into a radio frequency voltage signal via the resistors R1 and R2 for being finally output.

Such CMOS up-mixer has several defects: in one aspect, since M1~M4 work in the switching state, a relatively strong local oscillator signal is required, and the power consumption is relatively high. In another aspect, due to the low operating voltage of the CMOS process, the low current density, and the voltage drop across the resistors R1 and R2, the output power is low. In the third aspect, in order to realize linear conversion, when M5 and M6 convert the baseband voltage signal into the baseband current signal, M5 and M6 must work in a fully conducting state. When the input voltage signal is relatively low, M5 and M6 will enter the cut-off state, and the linearity is poor.

SUMMARY

The technical problem mainly solved by the present invention is to provide a power mixer, radio frequency circuit, device, and equipment, which can improve the linearity and efficiency of baseband voltage signal conversion into baseband current model, save power consumption, and increase output power.

In order to achieve the above objective, the first technical solution adopted by the present invention is to provide a power mixer, characterized by comprising: a mixer module, which amplifies an analog baseband current signal by a silicon germanium heterojunction bipolar transistor amplifying circuit, and converts a local oscillator voltage signal into a local oscillator current signal by a silicon germanium heterojunction bipolar transistor switching circuit, wherein the silicon germanium heterojunction bipolar transistor switching circuit receives the amplified analog baseband current signal, and mixes the amplified analog baseband current signal and the local oscillator current signal into a radio frequency current signal; and a transformer module, which converts the radio frequency current signal into a radio frequency power signal and then outputs the radio frequency power signal from the power mixer.

In order to achieve the foregoing objective, the second technical solution adopted by the present invention is to provide a radio frequency circuit including the power mixer in the first technical solution.

In order to achieve the above object, the third technical solution adopted by the present invention is to provide a chip including the radio frequency circuit in the second technical solution.

In order to achieve the above objective, the fourth technical solution adopted by the present invention is to provide a wireless communication device including the chip in the third technical solution.

The beneficial effects of the present invention are: the present invention designs a power mixer, which combines a silicon germanium (SiGe) heterojunction (HBT) bipolar transistor amplifying circuit, a silicon germanium (SiGe) heterojunction (HBT) bipolar transistor switching circuit and a transformer circuit. The present application improves the linearity and efficiency of converting a baseband voltage signal into a baseband current model, saves power consumption, and improves output power.

Figure 1:
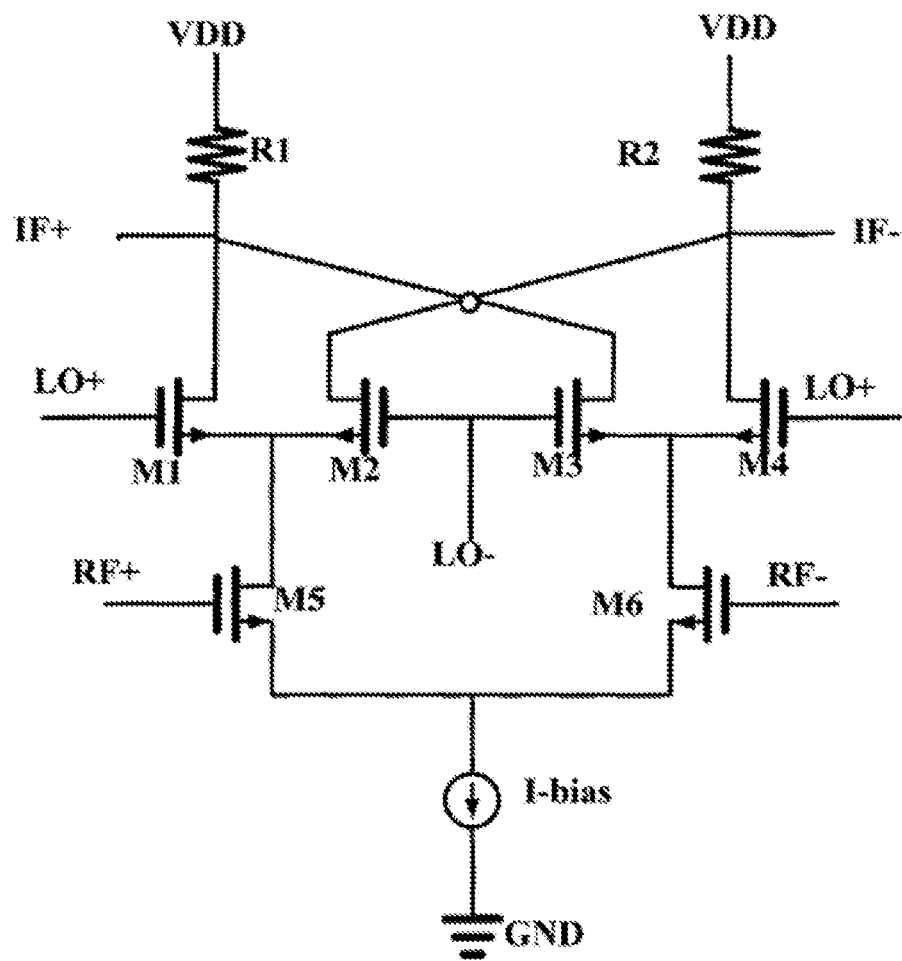
FIG. 1 is a schematic diagram of a prior art CMOS up-mixer structure.

The symbols of the components in the drawings are as follows: 101—capacitor one, 102—first inductance, 103—second inductance, 104—third inductance, 105—fourth inductance, 106—capacitor two, 107—capacitor three, 201—capacitor four, 202—resistance one, 203—resistance two, 204—triode one, 205—resistor three, 206—resistor four, 207—triode two, 208—resistor five, 209—resistor six, 210—triode three, 211—resistance seven, 212—resistance eight, 213—triode four, 214—resistance nine, 215—triode five, 216—triode six, 217—triode seven, 218—resistance ten, 219—resistor eleven, 220—resistance twelve, 221—triode eight, 222—resistance thirteen, 223—resistance fourteen, 224 triode nine, 225—resistance fifteen, 226—resistance sixteen, 227—triode ten, 228 resistor seventeen, 229—resistance 18, 230—capacitor five, 231—capacitor six, 232—resistance nineteen, 233—resistance twenty, 234—triode eleven, 235—triode twelve, 236—resistance twenty—one, 237—resistance twenty—two, 238—capacitor seven, 239—capacitor eight, 240—resistance twenty—three, 241—resistance twenty—four, 242—triode thirteen, 243—triode fourteen, 244—resistance twenty—five, 245—resistance twenty—six, 246—capacitor nine.

DESCRIPTION OF THE EMBODIMENTS

The preferred embodiments of the present invention will be described in detail below in conjunction with the accompanying drawings, so that the advantages and features of the present invention can be more easily understood by those skilled in the art, so as to make a clearer definition of the protection scope of the present invention.

It should be noted that the terms "first", "second", "third", etc. in the claims and specification of this application are used to distinguish similar objects, and not necessarily used to describe a specific sequence or sequence.

The present invention adopts a silicon germanium (SiGe) heterojunction (HBT) triode process, and specifically provides a power mixer, which combines a silicon germanium (SiGe) heterojunction (HBT) bipolar transistor amplifying circuit, a silicon germanium (SiGe) heterojunction (HBT) bipolar transistor switching circuit and a transformer circuit. The present application not only utilizes the high gain characteristics of SiGe technology, but also combines the characteristics of bipolar transistors that can play a switching role in saturation and cut-off states. Using a bipolar transistor switch circuit to replace the traditional CMOS tube switch circuit can convert the local oscillator voltage signal into a vibration current signal, thereby reducing the power consumption of the local oscillator drive circuit.

Figure 2:
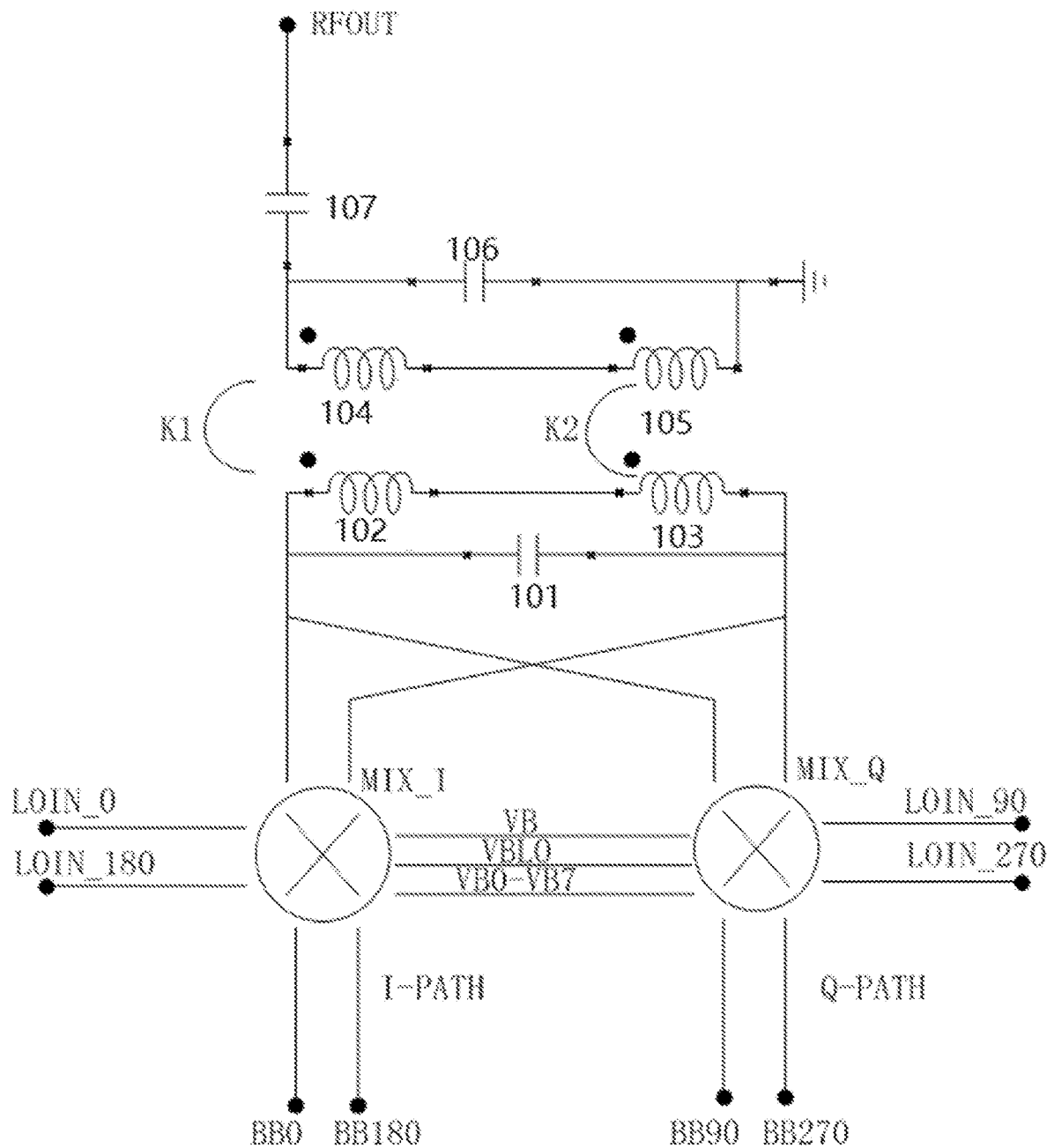
FIG. 2 is a schematic diagram of the structure of a power mixer of the present invention.

FIG. 2 shows a specific embodiment of a power mixer structure of the present invention. In this embodiment, the power mixer of the present invention includes a mixer module and a transformer module. The mixer module mixes the baseband current signal and the local oscillator signal to generate a radio frequency current signal, and the transformer module receives the radio frequency current, converts it into a radio frequency power signal and output.

In an embodiment of the present invention, the analog baseband current signal BB0 input by the analog baseband is input to the BBP_IN of a I-path mixer module circuit. BB90 is input to the BBP_IN of a Q-path mixer module circuit, BB180 is input to the BBN_IN of the I-path mixer module circuit, and BB270 is input to the BBN_IN of the Q-path mixer module circuit. The structure of the I-path mixer module circuit is the same as that of the Q-path mixer module circuit. I-path local oscillator voltage signal (LOIN-0 or LOIN180) and I-path baseband current signal (BB0 or BB180) are mixed to generate two paths of radio frequency current signals. One of the radio frequency current signals is input from the first radio frequency current signal output terminal to the common connection terminal between a first inductor 102 and the capacitor 101 (third capacitor) of the transformer module, another radio frequency current signal is input from the second radio frequency current signal output terminal to the common connection terminal between the second inductor 103 and the capacitor 101 (third capacitor) of the transformer module.

The Q-path local oscillator voltage signal (LOIN-90 or LOIN270) and the Q-path baseband current signal (BB90 or BB270) are mixed to generate two radio frequency current signals. One of the radio frequency current signals is input from the first radio frequency current signal output terminal to the common connection terminal between the first inductor 102 and the capacitor 101 (third capacitor) of the transformer module. The other radio frequency current signal is input from the second radio frequency current signal output terminal to the common connection terminal between the second inductor 103 and the capacitor 101 (third capacitor) of the transformer module.

In an embodiment of the present invention, the radio frequency current signal input circuit of the transformer module is composed of a first inductor 102, a second inductor 103 and a capacitor 101 (third capacitor). The first inductor 102 and the second inductor 103 are connected in series, and the other terminal of the first inductor 102 is connected to one pole of the capacitor 101 (third capacitor), a radio frequency current signal receiving terminal is formed between the first inductor 102 and the second inductor 103 and is connected to the first radio frequency current signal output terminal in the mixer module. The other terminal of the second inductor 103 is connected to the other pole of the capacitor 101 (third capacitor), and another radio frequency current signal receiving terminal is formed between the second inductor 103 and the capacitor 101, the radio frequency current signal receiving terminal is connected to the second radio frequency current signal output terminal in the mixer module.

The radio frequency power signal output circuit of the transformer module is composed of a third inductor 104, a fourth inductor 105, a second capacitor 106 (a fourth capacitor) and a third capacitor 107 (a fifth capacitor). The third inductor 104 and the fourth inductor 105 are connected in series, the other terminal of the third inductor 104 is connected to one pole of the capacitor two 106 and the one pole of the capacitor three 107, and the other terminal of the fourth inductor 105 is connected to the other pole of the capacitor two 106 and connected to the ground, the other pole of the capacitor three 107 is connected to the output terminal of the radio frequency power signal.

In this transformer module, the first inductor 102 and the third inductor 104 have mutual inductance, and the mutual inductance coefficient is K1, the second inductor 103 and the fourth inductor 105 have mutual inductance, and the mutual inductance coefficient is K2, and the turns ratio of the transformer is 1:1. When the transformer is outputting at low power, the post-stage power amplifier can be omitted (for example, the output power is about 10 dBm). When the output power of the transformer increases to about 20 dBm, it can act as the first gain stage of the power amplifier, thereby simplifying the system and saving power consumption.

Figure 3:
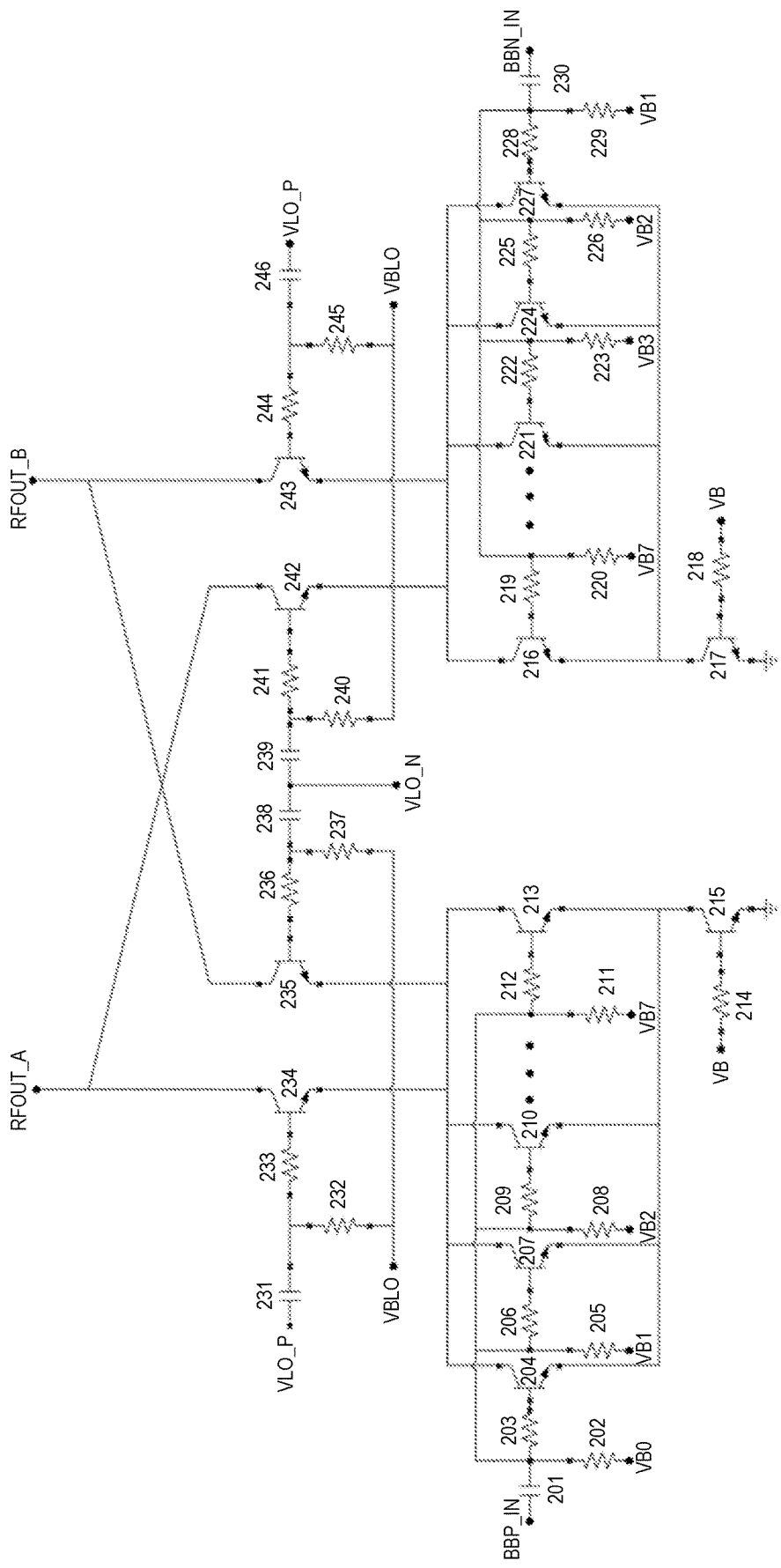
FIG. 3 is a schematic diagram of the circuit structure of a mixer module of the present invention.

FIG. 3 shows a specific embodiment of the circuit structure of a mixer module of the present invention. In this embodiment, the power mixer module circuit of the present invention includes a silicon germanium heterojunction bipolar transistor amplifying circuit and a silicon germanium heterojunction bipolar transistor switching circuit. The silicon germanium heterojunction bipolar transistor amplifying circuit amplifies the analog baseband current signal input by the analog baseband, and the amplified analog baseband current signal is input to the silicon germanium heterojunction bipolar transistor switching circuit. The silicon germanium heterojunction bipolar transistor switch circuit converts the local oscillator voltage signal into the local oscillator current signal, the silicon germanium heterojunction bipolar transistor switch circuit receives the amplified analog baseband current signal and mixes it with the local oscillator current signal to obtain the radio frequency current signal.

In an embodiment of the present invention, the silicon germanium heterojunction bipolar transistor amplifying circuit is composed of two identical units, and the two units respectively process the I-path baseband current signal and the Q-path baseband current signal. Each unit includes nine silicon germanium heterojunction bipolar transistors, seventeen bias resistors, and one capacitor (capacitor four 201 or capacitor five 230).

The following takes the I-path baseband current signal amplifying circuit as an example to illustrate its specific structure:

The I-path baseband current signal amplifying circuit includes eight parallel units, and each unit is composed of a silicon germanium heterojunction bipolar transistor and two series-connected upper bias resistors (a first resistor and a second resistor). One terminal of a bias resistor (the first resistor) is connected to the base of the silicon germanium heterojunction bipolar transistor, and one terminal of the other bias resistor (the second resistor) is connected to a bias voltage input terminal. A bias voltage is provided for the bias circuit to adjust the magnitude of the output current signal of the collector of the silicon germanium heterojunction bipolar transistor. A connection point is set between the two bias resistors, and one pole of the capacitor four 201 is connected through the connection point. Furthermore, the other pole of the capacitor four 201 is connected to the input terminal of the I-path analog baseband current signal. The I-path baseband current signal is input through the input terminal of the analog baseband current signal. The emitter of the silicon germanium heterojunction bipolar transistor is connected to the collector of the ninth silicon germanium heterojunction bipolar transistor.

As shown in FIG. 3, in the eight parallel units, resistor one 202, resistor two 203, triode one 204 constitute a unit, resistor three 205, resistor four 206, triode two 207 constitute a unit, resistor five 208, resistor six 209, triode three 210 constitutes a unit. Resistor seven 211, resistor eight 212, and triode four 213 constitute a unit, and there are four units that are not shown in detail. A connection point between resistor one 202 and resistor two 203, a connection point between resistor three 205 and resistor four 206, a connection point between resistor five 208 and resistor six 209, a connection point between resistor seven 211 and resistor eight 212 point, and a connection point between the remaining four cells and the two bias resistors are connected to each other and connected one pole of the capacitor four 201. Therefore, the other pole of the capacitor four 201 is connected to the input terminal BBP_IN of the I-path analog baseband current signal. The triode collectors of the eight units are connected to each other and are connected to two baseband current signal output lines so as to communicate with the silicon germanium heterojunction bipolar transistor switching circuit. The two output lines are respectively connected to the emitter of the triode eleven 234 and the emitter of the triode twelve 235. The triode emitters of the eight units are interconnected and connected to the collector of the ninth triode (triode five 215). The base of the triode five 215 is connected to a bias resistor (the third resistor or the resistor nine 214), and the other terminal of the resistor nine 214 is connected to a bias voltage input terminal, and the bias voltage input terminal provides the triode five 215 with a bias voltage VB. The emitter of triode five 215 is grounded.

The structure of the Q-path baseband current signal amplifying circuit is the same as that of the I-path baseband current signal amplifying circuit, wherein the connection points between the eight bias resistors are connected to each other and are connected to one pole of the capacitor five 230, and then pass through the other pole of the capacitor five 230 connect to the input terminal BBN_IN of the Q path analog baseband current signal. The triode collectors of the eight units are connected to each other and are connected to two baseband current signal output lines so as to communicate with the silicon germanium heterojunction bipolar transistor switching circuit. The two output lines are respectively connected to the emitter of the triode thirteen 242 and the emitter of the triode fourteen 243. The triode emitters of the eight units are interconnected and connected to the collector of the ninth triode (triode seven 217). The base of the triode seven 217 is connected to a bias resistor (resistor ten 218), and the other terminal of the resistor ten 218 is connected to a bias voltage input terminal, and the bias voltage input terminal provides the triode seven 217 with a bias voltage VB. The emitter of triode seven 217 is grounded.

The gain stage of the mixer module consists of eight side-by-side silicon germanium heterojunction bipolar transistors in the Q-path baseband current signal amplifying circuit and eight side-by-side silicon germanium heterojunctions in the I-path baseband current signal amplifying circuit. The area of the emitter region of the silicon germanium heterojunction bipolar transistor is incremented by binary. The current magnification can be switched by changing the number of the sixteen silicon germanium heterojunction bipolar transistors that are turned on. The bias voltages input by the sixteen silicon germanium heterojunction bipolar transistor bias circuits can be set individually or in any combination, so as to adjust the amplification factor of the baseband current signal according to the needs of practical applications.

In one embodiment of the present invention, the silicon germanium heterojunction bipolar transistor switching circuit consists of two cells with the same structure. Therein, a unit converts the I-path local oscillator voltage signal (LOIN-0 or LOIN180) into a local oscillator current signal, and mixes the amplified baseband current signal of path I with the I-path local oscillator current signal and processes it into a radio frequency current signal. Another unit converts the Q-path local oscillator voltage signal (LOIN-90 or LOIN270) into a local oscillator current signal, and mixes the amplified Q-path baseband current signal with the Q-path local oscillator current signal into a radio frequency current signal.

Each switch circuit unit includes two silicon germanium heterojunction bipolar transistors, four bias resistors and two capacitors.

The following takes the I signal switch circuit as an example to illustrate its specific structure:

The I-path signal switch circuit includes two silicon germanium heterojunction bipolar transistors (triode eleven 234 and triode twelve 235) arranged in parallel. The base terminal of each silicon germanium heterojunction bipolar transistor (triode eleven 234 or triode twelve 235) is connected in series with a fourth resistor (resistor twenty 233 or resistor twenty one 236) and a fifth resistor (resistor ten Nine 232 or resistor twenty-two 237), the other terminal of the fifth resistor (resistor nineteen 232 or resistor twenty-two 237) is connected to a bias voltage input terminal to input the bias voltage VBLO. A connection point is set between the fourth resistor and the fifth resistor, the connection point is connected to one pole of the second capacitor (capacitor six 231 or capacitor seven 238), and the other pole of the second capacitor is connected to the local oscillator voltage signal input terminal, the two local oscillator voltage signal input terminals are respectively connected to the I-path local oscillator voltage signal with a phase difference of 180°. For example, capacitor six 231 is connected to VLO-P at 0° and capacitor seven is connected to VLO-N at 180°.

The emitter terminals of the two SiGe heterojunction bipolar transistors are respectively connected to the SiGe heterojunction bipolar transistor amplifying circuit to receive the amplified analog baseband current signal. The collector terminals of the two silicon germanium heterojunction bipolar transistors are respectively connected to the first radio frequency current signal output terminal and the second radio frequency current signal output terminal.

As shown in FIG. 3, the base of a silicon germanium heterojunction bipolar transistor (triode eleven 234) is connected in series with two bias resistors (resistor nineteen 232 and resistor twenty 233), the other terminal of the resistor nineteen 232 (the fifth resistor) is connected to the local oscillator bias voltage input terminal to input the bias voltage VBLO. A connection point is set between resistor nineteen 232 (fifth resistor) and resistor twenty 233 (fourth resistor), this connection point is connected to one pole of capacitor six 231 (second capacitor), and the other pole of capacitor six 231 is connected the input terminal of the local oscillator voltage signal of path I, so that the 0° local oscillator voltage signal VLO-P is input to the input terminal. The collector of the triode eleven 234 is connected to the first radio frequency current signal output terminal, so that the radio frequency current signal formed by mixing the I-path local oscillator current signal and the I-path baseband current signal is input to the transformer module. The emitter of the triode eleven 234 is connected to the baseband current signal output line of the I-path baseband current signal amplifying circuit.

The base of another silicon germanium heterojunction bipolar transistor (triode twelve 235) is connected in series with two bias resistors (resistor twenty one 236 and resistor twenty two 237), and resistor twenty two 237 (fifth resistor), the other terminal is connected to the local oscillator bias voltage input terminal to input the bias voltage VBLO. A connection point is set between resistor twenty two 237 (fifth resistor) and resistor twenty one 236 (fourth resistor). This connection point is connected to one pole of capacitor seven 238 (second capacitor) and the other pole of capacitor seven 238 is connected to the input terminal of the 180° I local oscillator voltage signal, so that the input terminal inputs the I local oscillator voltage signal VLO-N. The collector of the triode twelve 235 is connected to the second radio frequency current signal output terminal, so that the radio frequency current signal formed by mixing the I-path local oscillator current signal and the I-path baseband current signal is input into the transformer module. The emitter of the triode twelve 235 is connected to the baseband current signal output circuit of the I-path baseband current signal amplifying circuit.

The structure of the Q-path signal switch circuit is the same as the above I-path signal switch circuit.

As shown in FIG. 3, the base of a silicon germanium heterojunction bipolar transistor (triode fourteen 243) is connected in series with two bias resistors (resistance twenty-five 244 and resistor twenty-six 245), and the other terminal of the resistor twenty-six 245 (fifth resistor) is connected to the local oscillator bias voltage input terminal to input the bias voltage VBLO. A connection point is set between resistor twenty-six 245 (fifth resistor) and resistor twenty-five 244 (fourth resistor). This connection point is connected to one pole of capacitor nine 246 (second capacitor) and the other pole of capacitor nine 246 is connected to the input terminal of the Q-path local oscillator voltage signal, so that the 90° Q-path local oscillator voltage signal VLO-P is input from the input terminal. The collector of the triode fourteen 243 is connected to the second radio frequency current signal output terminal, so that the radio frequency current signal formed by mixing the Q-path local oscillator current signal and the Q-path baseband current signal is input into the transformer module. The emitter of the triode fourteen 243 is connected to the baseband current signal output circuit of the Q-path baseband current signal amplifying circuit.

The base of another silicon germanium heterojunction bipolar transistor (triode thirteen 242) is connected in series with two bias resistors (resistor twenty-four 241 and resistor twenty-three 240), and the other terminal of resistor twenty-three 240 (fifth resistor) is connected to the local oscillator bias voltage input terminal to input the bias voltage VBLO. A connection point is set between resistor twenty-three 240 (fifth resistor) and resistor twenty-four 241 (fourth resistor). This connection point is connected to one pole of capacitor eight 239 (second capacitor) and the other pole of capacitor eight 239 is connected to the input terminal of the Q-path local oscillator voltage signal, so that a 270° Q-path local oscillator voltage signal VLO-N is input from the input terminal. The collector of the triode thirteen 242 is connected to the first radio frequency current signal output terminal, so that the radio frequency current signal formed by mixing the Q-path local oscillator current signal and the Q-path baseband current signal is input into the transformer module. The emitter of the triode thirteen 242 is connected to the baseband current signal output circuit of the Q-path baseband current signal amplifying circuit.

After using the silicon germanium heterojunction bipolar transistor switch circuit in the present invention, due to the effect of the bias circuit, compared with the strong local oscillator signal in the CMOS transistor circuit in FIG. 1, the present invention can reduce the intensity of the local oscillator signal to obtain the same mixing effect.

This type of power mixer can be used in radio frequency circuits, which can be used in low-power Bluetooth chip-level systems, and can also be used in other chips that need to include power mixer radio frequency circuits, and further used in Bluetooth products, wireless routers, mobile phones, mobile communication base stations and other wireless communication equipments.

The present invention combines a silicon germanium (SiGe) heterojunction (HBT) bipolar transistor amplifying circuit, a silicon germanium (SiGe) heterojunction (HBT) bipolar transistor switching circuit and a transformer circuit to design a power hybrid frequency converter, so as to improve the linearity and efficiency of baseband voltage signal conversion into baseband current model, save power consumption and increase output power.

The above are only the embodiments of the present invention, which do not limit the scope of the present invention. Any equivalent structural transformations made by using the contents of the description and drawings of the present invention, or directly or indirectly applied to other related technical fields, are the same. The theory is included in the scope of patent protection of the present invention.

What is claimed is:
1. A power mixer, comprising:
   a mixer module, which amplifies an analog baseband current signal by a silicon germanium heterojunction bipolar transistor amplifying circuit, and converts a local oscillator voltage signal into a local oscillator current signal by a silicon germanium heterojunction bipolar transistor switching circuit, wherein the silicon germanium heterojunction bipolar transistor switching circuit receives the amplified analog baseband current signal, and mixes the amplified analog baseband current signal and the local oscillator current signal into a radio frequency current signal; and
   a transformer module, which converts the radio frequency current signal into a radio frequency power signal and then outputs the radio frequency power signal from the power mixer, wherein the silicon germanium heterojunction bipolar transistor amplifying circuit is composed of two identical units, and the two units of the silicon germanium heterojunction bipolar transistor amplifying circuit process a I signal and a Q signal respectively, each of the units of the silicon germanium heterojunction bipolar transistor amplifying circuit includes:

eight silicon germanium heterojunction bipolar transistors arranged in parallel, wherein a base terminal of each of the eight silicon germanium heterojunction bipolar transistors is connected in series with a first resistor and a second resistor, and the other terminal of the second resistor is connected with one bias voltage input terminal, a first connection point is set between the first resistor and the second resistor, the eight first connection points are interconnected to each other and connected to one pole of a first capacitor, the other pole of the first capacitor is connected an input terminal of the analog baseband current signal, emitter terminals of the eight silicon germanium heterojunction bipolar transistors are connected to each other, and collector terminals of the eight silicon germanium heterojunction bipolar transistors are connected to each other to form two baseband current signal output lines, which are connected to the silicon germanium heterojunction bipolar transistor switching circuit; and a ninth silicon germanium heterojunction bipolar transistor, which has a collector connected to the emitter terminals of the eight silicon germanium heterojunction bipolar transistors, an emitter grounded, and a base connected to a third resistor, wherein the other terminal of the third resistors is connected to a bias voltage input terminal.

2. The power mixer of claim 1, wherein the eight bias voltage input terminals are set individually or combined arbitrarily.

3. The power mixer of claim 1, wherein the silicon germanium heterojunction bipolar transistor switching circuit is composed of two identical units, the two units of the silicon germanium heterojunction bipolar transistor switching circuit process a I signal and a Q signal respectively, and each of the units of the silicon germanium heterojunction bipolar transistor switching circuit includes:

two silicon germanium heterojunction bipolar transistors arranged in parallel, wherein a base terminal of each of the two silicon germanium heterojunction bipolar transistors is connected in series with a fourth resistor and a fifth resistor, and the other terminal of the fifth resistor is connected with one bias voltage input terminal, a second connection point is set between the fourth resistor and the fifth resistor, the second connection point is connected to one pole of a second capacitor, and the other pole of the second capacitor is connected to an input terminal of the local oscillator voltage signal, the two input terminals of the local oscillator voltage signal are connected respectively to local oscillator voltage signals with a phase difference of 180°; and an emitter terminal of each of the two silicon germanium heterojunction bipolar transistors is respectively connected to the silicon germanium heterojunction bipolar transistor amplifying circuit to receive the amplified analog baseband current signal, collector terminals of the two silicon germanium heterojunction bipolar transistors are connected respectively to a first radio frequency current signal output terminal and a second radio frequency current signal output terminal.

4. The power mixer of claim 1, wherein the transformer module comprises:

a radio frequency current signal input circuit, which is connected in series via a first inductor and a second inductor, wherein the other terminal of the first inductor is connected to one pole of the third capacitor and connected to the mixer module, so as to receive the radio frequency current signal, and the other terminal of the second inductor is connected to the other pole of the third capacitor and connected to the mixer module, so as to receive the radio frequency current signal; and a radio frequency power signal output circuit, which is connected in series via a third inductor and a fourth inductor, wherein the other terminal of the third inductor is connected to one pole of a fourth capacitor and one pole of a fifth capacitor, the other terminal of the fourth inductor is connected to the other pole of the fourth capacitor and connected to the ground, and the other pole of the fifth capacitor is connected to an output terminal of the radio frequency power signal.

5. The power mixer of claim 4, wherein the first inductor and the third inductor have mutual inductance, the second inductor and the fourth inductor have mutual inductance, and the transformer has a turns ratio of 1:1.

6. A radio frequency circuit, comprising the power mixer according to claim 1.

7. A chip, comprising the radio frequency circuit according to claim 6.

8. A wireless communication device, comprising the chip according to claim 7.

* * * * *